(12) United States Patent
Sue et al.

(10) Patent No.: US 6,207,789 B1
(45) Date of Patent: Mar. 27, 2001

(54) PHENOLIC RESIN, RESIN COMPOSITION, MOLDING MATERIAL FOR ENCAPSULATION, AND ELECTRONIC COMPONENT DEVICE

(75) Inventors: Haruaki Sue, Tsukuba; Shinsuke Hagiwara, Shimodate; Fumio Furusawa, Yuki; Seiichi Akagi, Ibaraki-ken; Kazuyoshi Tendo, Tsukuba, all of (JP)

(73) Assignee: Hitachi Chemical Co., Ltd. (JP)

( * ) Notice: Subject to any disclaimer, the term of this patent is extended or adjusted under 35 U.S.C. 154(b) by 0 days.

(21) Appl. No.: 09/445,275

(22) PCT Filed: Jun. 3, 1998

(86) PCT No.: PCT/JP98/02452

§ 371 Date: Dec. 3, 1999

§ 102(e) Date: Dec. 3, 1999

(87) PCT Pub. No.: WO98/55523

PCT Pub. Date: Dec. 10, 1998

(30) Foreign Application Priority Data

| Jun. 3, 1997 | (JP) | 9-145077 |
| Dec. 2, 1997 | (JP) | 9-331587 |
| Jan. 27, 1998 | (JP) | 10-013943 |

(51) Int. Cl.[7] .............................. C08G 14/04; C08G 8/04; C08G 58/08; C08G 65/00

(52) U.S. Cl. .......................... 528/153; 528/87; 528/104; 528/129; 528/137; 528/154; 528/155; 528/403; 528/425; 525/480; 525/481; 525/482; 525/534; 523/423; 523/424

(58) Field of Search ................ 528/153, 87, 104, 528/129, 137, 154, 155, 403, 425; 525/480, 481, 482, 534; 523/423, 424

(56) References Cited

U.S. PATENT DOCUMENTS

| 4,701,479 | * | 10/1987 | Toshio et al. | 523/220 |
| 4,701,482 | * | 10/1987 | Kurio et al. | 523/435 |
| 5,162,400 | * | 11/1992 | Toshio et al. | 523/466 |
| 5,298,548 | * | 3/1994 | Toshio et al. | 523/443 |
| 5,312,878 | * | 5/1994 | Toshio et al. | 525/507 |
| 5,344,899 | * | 9/1994 | Masami et al. | 525/534 |
| 5,358,980 | * | 10/1994 | Toshio et al. | 523/427 |
| 5,360,837 | * | 11/1994 | Shiro et al. | 523/220 |
| 5,418,266 | * | 5/1995 | Toshio et al. | 523/443 |
| 5,476,884 | * | 12/1995 | Keiji et al. | 523/443 |
| 5,510,428 | * | 4/1996 | Yoshiyuki et al. | 525/438 |

FOREIGN PATENT DOCUMENTS

| 64-065116 | 3/1989 | (JP) . |
| 1-283280 | 11/1989 | (JP) . |
| 3-000717 | 1/1991 | (JP) . |
| 3-207714 | 9/1991 | (JP) . |
| 9-291128 | 11/1997 | (JP) . |

OTHER PUBLICATIONS

"Synthesis and study of β–naphthol–ketone resins" by Hassan, E.A. and Saleh, R.M., *Acta Chim*, 78(4):439–447, 1973.

* cited by examiner

*Primary Examiner*—Duc Truong
(74) *Attorney, Agent, or Firm*—Pennie & Edmonds LLP

(57) ABSTRACT

The present invention provides a resin containing in the backbone chain a structural unit represented by the following Formula (I) or (II), as a novel phenolic resin having a high Tg, a low moisture absorption, a low molding shrinkage, high adhesive properties and high flow properties. The present invention also provides a resin composition and a molding material each containing the above resin, and an electronic component device having a device element encapsulated with it.

20 Claims, 12 Drawing Sheets

PHENOLIC RESIN, RESIN COMPOSITION, MOLDING MATERIAL FOR ENCAPSULATION, AND ELECTRONIC COMPONENT DEVICE

TECHNICAL FIELD

This invention relates to a resin compound suited for encapsulation molding materials, laminating materials or adhesive materials; a resin composition, an encapsulation molding material, a laminating material and an adhesive material which make use of the compound; and an electronic component device whose elements are encapsulated with the encapsulation molding material.

BACKGROUND ART

Molding epoxy resin materials are conventionally in wide use for the encapsulation of device elements in electronic component parts such as transistors and ICs (integrated circuits). This is because the epoxy resin has properties such as molding properties, electrical properties, moisture resistance, heat resistance, mechanical properties and adhesion to component inserts which are all well balanced. In particular, a combination of o-cresol novolak epoxy resin with a phenolic novolak resin is superior in view of the balance of these properties, and is widely used as base resins of encapsulation molding materials.

In recent years, with progress of high-density packaging on printed circuit boards of electronic component parts, conventional through-hole mount packages such as DIP (dual in-line package) have become less used, and small-sized thin surface mount packages such as QFP (quad flat package), SOP (small out-line package), TQFP (thin quad flat package) and TSOP (thin small out-line package) have become more used. The surface mount packages are different in the manner of packaging from the conventional through-hole mount packages. Device elements are provisionally fastened to the wiring board surface and thereafter soldered using a solder bath or a reflowing tool, and hence the whole package is inevitably exposed to soldering heat. Thus, in the case of the surface mount packages, when packages stand moisture-absorbed, the absorbed moisture vaporizes and expands abruptly upon heating at the time of soldering, bringing about the problem of separation at adhesion interface or package cracking.

Accordingly, in order to solve such a problem, the improvement of molding materials has been made energetically. In order to avoid the package cracking during the reflowing process, the epoxy resin, and curing agents of a resin component of molding materials have been reconsidered. As a result, various molding materials compounded with a biphenyl skeleton epoxy resin having a lower hygroscopicity and better adhesive properties than the conventional o-cresol novolak epoxy resin are proposed (e.g., Japanese Patent Applications Laid-open (KOKAI) No. 64-65116 and No. 3-207714). At present, molding materials compounded with this biphenyl skeleton epoxy resin have begun to be put into practical use as materials for the encapsulation of surface mount packages, and have greatly contributed to the improvement in reflow resistance of the surface mount packages.

The molding materials compounded with the biphenyl skeleton epoxy resin have a reflow resistance remarkably superior to that of molding materials compounded with the conventional o-cresol novolak epoxy resin, but have a problem that the resin has a low glass transition point (Tg). Thus, there is a limit in application. Accordingly, a resin having much lower moisture absorption and higher adhesion has been sought.

DISCLOSURE OF THE INVENTION

The present invention was made taking account of the problems discussed above. A first object of the present invention is to provide a novel phenolic resin having a high flexibility in use, a high Tg, a low moisture absorption, high flow properties and superior adhesive properties, which is suited for encapsulation molding materials, laminating materials or adhesive materials, and a resin composition containing such a phenolic resin.

A second object of the present invention is to provide a molding material that may cause no reflow cracking even when soldering is carried out without taking any measure against moisture absorption, such as special pretreatment or wrapping, and an electronic component device whose elements are encapsulated with such a molding material.

The present inventors have found that a phenolic resin containing a specific polycyclic aromatic group is effective for solving the above problems, and have accomplished the present invention on the basis of this finding.

To achieve the first object, the present invention provides a phenolic resin (A) containing in the backbone chain a structural unit represented by the following Formula (I) or (II).

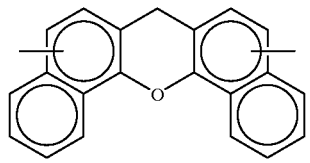

(I)

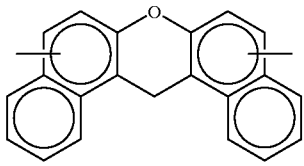

(II)

Of the resins having the structural unit of Formula (I) or (II), the phenolic resin (A) of the present invention may preferably be those represented by the following Formula (III) or (IV).

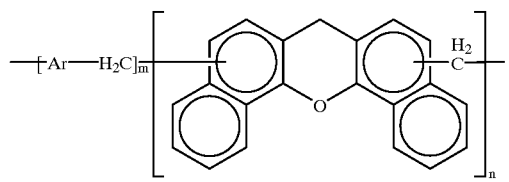

(III)

(IV)

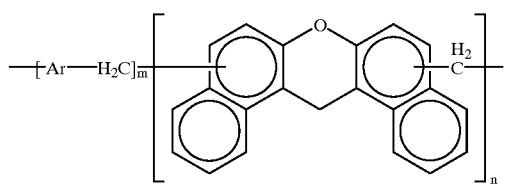

(V)

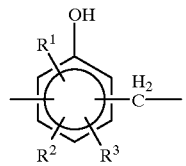

(VIa)

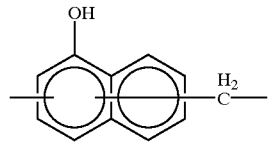

(VIb)

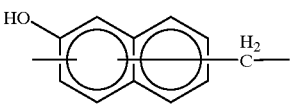

(VII)

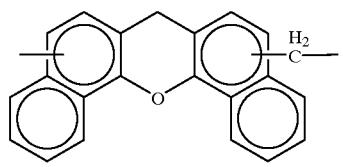

(VIII)

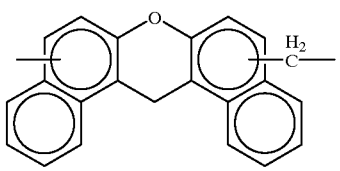

In these formulas, letter symbols m and n indicating the number of repeating units each represent a positive number. In order to achieve the above requirements in a well balanced state, the total of m and n may preferably be not more than 10 on the number average.

Ar represents at least one of divalent organic groups represented by

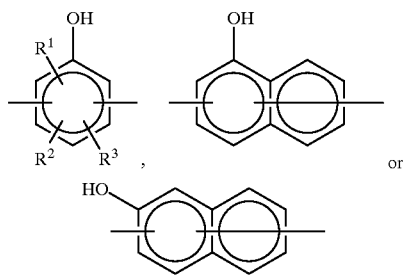

In the foregoing, $R^1$ to $R^3$ are groups each independently selected from a hydrogen atom and an alkyl group having 1 to 9 carbon atoms. In particular, they may each preferably be at least one of a hydrogen atom, a methyl group, an ethyl group, a propyl group, an isopropyl group and a t-butyl group. Also, the Ar's in one molecule may be the same or different, or may contain two or more types of atomic groups.

Such a phenolic resin (A) may include those containing in the resin backbone chain at least one of the following moieties (1) to (3). Incidentally, the phenolic resin (A) of the present invention may be either random copolymers or block copolymers, without regard to the manner of arrangement of the repeating units.

(1) A moiety in which the following component (V), the following component(s) (VIa) and/or (VIb) and the following component(s) (VII) and/or (VIII) combine at random, regularly or in blocks.

(2) A moiety in which the component (V) and the component(s) (VII) and/or (VIII) combine at random, alternately or in blocks.

(3) A moiety in which the component(s) (VIa) and/or (VIb) and the component(s) (VII) and/or (VIII) combine at random, alternately or in blocks.

The phenolic resins (A) of the present invention may be a mixture of two or more of the resins described above.

Of these phenolic resins (A) of the present invention, a resin composed chiefly of a copolymer in which the component (V), the component(s) (VIa) and/or (VIb) and the component(s) (VII) and/or (VIII) combine at random is particularly preferred.

The total of the components (VII) and (VIII) contained in the phenolic resin (A) may preferably be in an amount of from 2 to 50 mole %, and more preferably from 5 to 40 mole %, of the whole phenolic resin (A). Also, the total of the components (VIa) and (VIb) contained in the phenolic resin (A) may preferably be in an amount of from 10 to 80 mole %, and more preferably from 20 to 60 mole %, of the whole phenolic resin (A).

The phenolic resin (A) may also be used in such a state that it contains an oligomer comprising a random combination of the component (V) and the component(s) (VIa) and/or (VIb) or oligomers each constituted of the component (V), (VIa), (VIb), (VII) or (VIII) alone.

The resin composition containing the phenolic resin (A) have a high flexibility in use, and may widely be used as encapsulation molding materials, laminating materials or adhesive materials. For example, an epoxy resin composition making use of the phenolic resin (A) as a curing agent of epoxy resin has a low molding shrinkage, a high Tg, a low moisture absorption and high flow properties and has a superior adhesion, and hence is suited for encapsulation molding materials, laminating materials and adhesive materials. Besides, it may be used in a vast range of fields such as anisotropic conductive film materials and insulating materials.

In particular, a molding material making use of the phenolic resin (A) of the present invention as a curing agent of epoxy resin and compounded with a filler and so forth is suited for its use as materials for encapsulating electronic component devices. Thus, the present invention provides an epoxy resin molding material containing the phenolic resin (A), and an electronic component device whose elements are encapsulated with a cured product of the molding material.

BEST MODES FOR PRACTICING THE INVENTION

Figure 1:
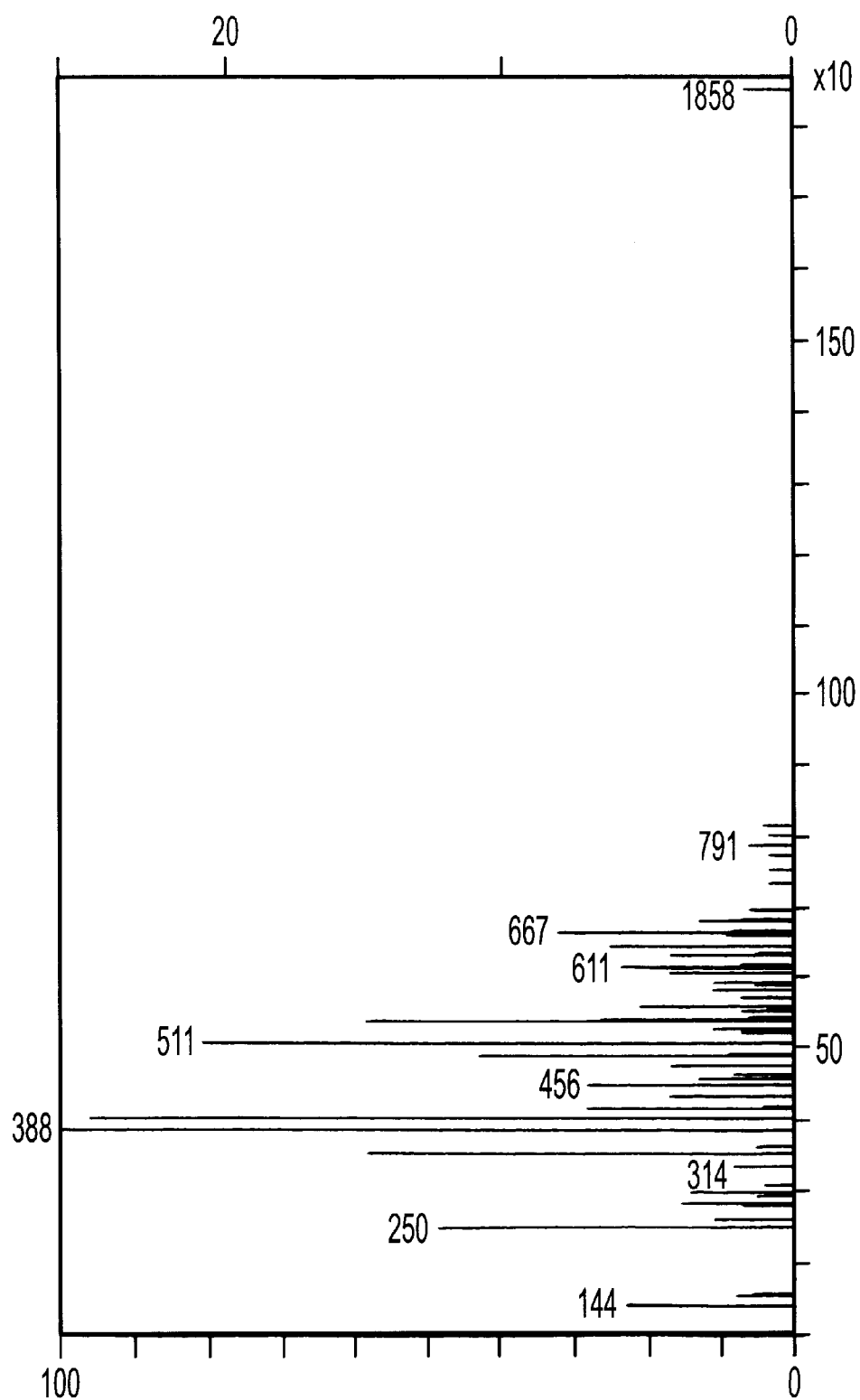
FIG. 1 is an FD-MS (field desorption mass spectrometry) spectrum of a resin obtained in Synthesis Example 1.

A. Synthesis of phenolic resin (A):

There are no particular limitations on the method of obtaining the phenolic resin (A) of the present invention. For example, a method may be used in which intramolecular ring-closing reaction caused by self-oxidation of naphthol as described below is used.

First, a kind of phenols containing 20 to 90 mole % of a kind of naphthols and an aldehyde are brought to initial-stage reaction in the presence of an acid catalyst (or in the absence of a catalyst) in the same manner as commonly available novolak resins (e.g., when formalin is used as the aldehyde, by refluxing at about 100° C.). Thus, monomers are polymerized.

This reaction is carried out for about 1 to 8 hours, and thereafter, in the presence of a strong acid and/or a super acid, temperature is raised to 120 to 180° C. while removing the water in the system. At this stage, the system may have an oxidizing atmosphere (e.g., in a stream of air). The intramolecular ring-closing reaction proceeds by maintaining this condition for 2 to 24 hours, to form the desired phenolic resin (A). Thereafter, unreacted monomers may be removed to obtain the desired phenolic resin (A).

In the above method, the phenolic resin (A) is obtained through two stages consisting of the initial-stage reaction and the intramolecular ring-closing reaction, but the synthesis of the phenolic resin (A) of the present invention is by no means limited to this method.

The naphthols used in the synthesis of the phenolic resin (A) may include 1-naphthol, 2-naphthol, 1,5-dihydroxynaphthalene, 1,6-dihydroxynaphthalene, 1,7-dihydroxynaphthalene and 2,6-dihydroxynaphthalene. Any of these may be used alone or in combination of two or more.

The phenols other than the naphthols may include phenolic compounds used in the synthesis of usual phenolic resins, as exemplified by phenol, o-cresol, p-cresol, m-cresol, butylphenol, xylenol, nonylphenol and allylphenol. Any of these may be used alone or in combination of two or more.

The aldehyde may include aldehydes used in the synthesis of usual phenolic resins, as exemplified by formaldehyde, acetaldehyde, benzaldehyde and salicylaldehyde. Any of these may be used alone or in combination of two or more. The aldehyde may preferably be reacted in an amount of from 0.3 to 1 mole per mole of the phenol.

As the acid used as a catalyst in the initial-stage reaction, a weak acid such as oxalic acid, a strong acid such as hydrochloric acid or a super acid may be used. The catalyst used in the intramolecular ring-closing reaction may include strong acids such as hydrochloric acid, sulfuric acid, p-toluenesulfonic acid and trifluoroacetic acid and super acids such as trifluoromethanesulfonic acid and methanesulfonic acid. Any of these acid catalysts may be used alone or in combination of two or more.

The acid catalyst may preferably be used in an amount of from 0.0001 to 0.1 mole per mole of the phenol, and may preferably be used in an amount of from 0.001 to 0.05 mole per mole of the phenols.

B. Resin composition/encapsulation molding material:

The resin composition/encapsulation molding material of the present invention contains the phenolic resin (A) described above, and may further optionally contain the following components (1) to (5) as occasion calls. The respective components are specifically described here.

Incidentally, the resin composition/encapsulation molding material of the present invention may be prepared by any methods as long as the materials of various types can uniformly dispersedly be mixed. A commonly available preparation method may include a method in which materials formulated in prescribed quantities are thoroughly mixed by means of a mixer and the mixture obtained is melt-kneaded by means of a mixing roll or an extruder, followed by cooling and then pulverization.

(1) Epoxy resin:

In the resin composition/encapsulation molding material of the present invention, any epoxy resins commonly used may be used. There are no particular limitations. Epoxy resins usable in the present invention include, e.g.;

epoxy resins obtained by epoxidizing novolak resins synthesized from phenols and aldehydes, including phenol novolak epoxy resin, o-cresol novolak epoxy resin and bisphenol-A novolak epoxy resin;

glycidylamine-type epoxy resins obtained by the reaction of diglycidyl ethers of bisphenol A, bisphenol F, bisphenol S, biphenol or alkyl-substituted biphenol or the like with polyamines such as diaminodiphenylmethane or isocyanuric acid and with epichlorohydrin;

epoxidized compounds of co-condensation resins of dicyclopentadiene or cyclopentadiene with phenols;

epoxy resins having a naphthalene ring;

epoxidized compounds of naphthol-aralkyl resins;

trimethylolpropane-type epoxy resins;

terpene-modified epoxy resins;

linear aliphatic epoxy resins obtained by oxidizing olefinic linkages with per-acids such as peracetic acid; and alicyclic epoxy resins. Any of these may be used alone or in combination of two or more.

(2) Epoxy resin curing agent:

The phenolic resin (A) used in the resin composition/encapsulation molding material of the present invention acts as a curing agent of epoxy resins. As the curing agent, the phenolic resin (A) may be used alone or in combination with any other conventionally known curing agent.

The curing agent usable in combination includes resins obtained by condensation or co-condensation of a kind of phenols such as phenol, cresol, resorcinol, catechol, bisphenol A and bisphenol F and/or a kind of naphthols such as 1-naphthol, 2-naphthol and dihydroxynaphthalene with an aldehyde such as formaldehyde in the presence of an acid catalyst, phenol aralkyl resins, and naphthol aralkyl resins. Any of these may be used alone or in combination of two or more.

The phenolic resin (A) may preferably be in a content of, but not particularly limited to, 30% by weight or more, and more preferably 50% by weight or more, based on the total weight of the curing agent.

With regard to an equivalent weight ratio of the curing agent including the phenolic resin (A) to the epoxy resin, i.e., the ratio of the number of hydroxyl groups in the curing agent to the number of epoxy groups in the epoxy resin, it may preferably be, but not particularly limited to, from 0.6 to 1.5, and more preferably from 0.8 to 1.2.

(3) Curing accelerator:

The resin composition/encapsulation molding material of the present invention may optionally be incorporated with a curing accelerator in order to accelerate the curing reaction of epoxy groups of the epoxy resin with phenolic hydroxyl groups of the phenolic resin.

Such a curing accelerator may include, e.g.;

tertiary amines such as 1,8-diaza-bicyclo(5,4,0)undecene-7, 1,5-diaza-bicyclo(4,3,0)nonene, 5,6-dibutylamino-1, 8-diaza-bicyclo(5,4,0)undecene-7, benzyldimethylamine, triethanolamine, dimethylaminoethanol and tris(dimethylaminomethyl)phenol, and derivatives of these;

imidazoles such as 2-methylimidazole, 2-phenylimidazole, 2-phenyl-4-methylimidazole, and derivatives of these;

organic phosphines such as tributylphosphine, methyldiphenylphosphine, triphenylphosphine, diphenylphosphine and phenylphosphine, and the like and phosphorus compounds having intramolecular polarization, formed by addition of any of these phosphines to a compound having π-bonds such as maleic anhydride, benzoquinone or diazophenylmethane; and tetraphenylboron salts such as tetraphenylphosphonium tetraphenylborate, tetraphenylphosphonium ethyltriphenylborate, tetrabutylphosphonium tetrabutylborate, 2-ethyl-4-methylimidazole tetraphenyl borate and N-methylimorpholine tetraphenylborate, and derivatives of these. Any of these may be used alone or in combination of two or more.

In the case when such a curing accelerator is used, it may preferably be mixed in an amount of from 0.005 to 3% by weight based on the total weight of the resin composition or encapsulation molding material.

(4) Inorganic filler:

The resin composition/encapsulation molding material of the present invention may optionally be incorporated with an inorganic filler in order to lower moisture absorption and coefficient of linear expansion, to improve thermal conductivity and to improve strength. Especially when used as the encapsulation molding material, it is desirable for the molding material to contain the inorganic filler.

The inorganic filler usable in the present invention may include powders or sphered beads of fused silica, crystal silica, glass, alumina, zircon, calcium silicate, calcium carbonate, silicon carbide, silicon nitride, aluminum nitride, boron nitride, beryllia, zirconia or potassium titanate, and single-crystal fibers of potassium titanate, silicon carbide, silicon nitride or aluminum oxide, and glass fibers. Any of these may be used by compounding one or more types.

As an inorganic filler having a flame-retardant effect, it may include aluminum hydroxide, magnesium hydroxide and zinc borate. Any of these may be used alone or in combination of two or more.

Of these inorganic fillers, fused silica is preferred from the viewpoint of lowering the coefficient of linear expansion, and aluminum oxide from the viewpoint of a high thermal conductivity. With regard to the shape of the filler, it may preferably be spherical or closely spherical in view of the flow properties and mold wear resistance at the time of molding.

In the case when the inorganic filler is incorporated, it may preferably be mixed in an amount of 60% (volume/volume) or more, and more preferably from 65 to 90% (volume/volume), of the total weight of the resin composition or encapsulation molding material.

(5) Other additives:

As other additives, the resin composition/encapsulation molding material of the present invention may optionally be incorporated with;

a surface-treating agent including coupling agents such as epoxysilane, aminosilane, ureidosilane, vinylsilane, alkylsilanes, organic titanates and aluminum alcoholates;

a flame retardant comprising bromated epoxy resin, antimony trioxide, phosphate and a nitrogen-containing compound, such as melamine resin and phosphazene;

a release agent including higher fatty acids, higher fatty acid metal salts and ester waxes;

a colorant such as carbon black; and a stress relaxation agent such as silicone oil or silicone rubber powder.

C. Electronic component device:

The electronic component device of the present invention can be produced by mounting an active element such as a semiconductor chip, a transistor, a diode or a thyristor or a passive element such as a capacitor, a resistor or a coil on a support member such as a lead frame, a tape carrier having been wired, a wiring board, glass or a silicon wafer, and encapsulating necessary portions with the encapsulation molding material of the present invention. As methods of encapsulation for the electronic component device, low-pressure transfer molding is most commonly used. Injection molding or compression molding may also be used.

The present invention is suited especially for semiconductor devices, and the electronic component device of the present invention may include, e.g., TCPs (tape carrier packages) in which a semiconductor chip connected to a tape carrier through a bump is encapsulated with the molding material of the present invention. It may also include COP (chip on board) modules, hybrid ICs or multi-chip modules in which an active element such as a semiconductor chip, a transistor, a diode or a thyristor and/or a passive element such as a capacitor, a resistor or a coils connected by wire bonding, flip-chip bonding or soldering to a wiring formed on a wiring board or glass are encapsulated with the encapsulation molding material of the present invention.

EXAMPLES

Synthesis examples and working examples of the present invention will be given below in detail with reference to drawings. The present invention is by no means limited to these.

A. Synthesis examples:

Synthesis examples of the phenolic resin of the present invention is given first. Test methods used in the following synthesis examples are as follows:

(1) Number-average molecular weight (Mn) and polydispersity (Mw/Mn):

A high-performance liquid chromatograph L6000, manufactured by Hitachi Ltd., and a data analyzer C-R4A, manufactured by Shimadzu Corporation, were used. As GPC columns for analysis, a combination of G2000HXL and G3000HXL, available from Tosoh Corporation, was used. Sample concentration was set at 0.2% (weight/volume), tetrahydrofuran was used as the mobile phase and the flow rate was set at 1.0 ml/minute to make measurement. To determine number-average molecular weight, a calibration curve was prepared using a polystyrene reference sample and was used to make calculation. Number-average molecular weights shown in the following synthesis examples and working examples are all in terms of polystyrene.

(2) FD-MS analysis (field desorption mass spectrometry):

Made using an M-2000 type double-focusing mass spectrometer with an FD-MS unit, manufactured by Hitachi Ltd. Resin was dissolved in acetone, and the solution obtained was coated on a carbon emitter to make measurement under the following conditions.

Emitter heating current: 0→25 mA/min., 5 mA/min.

Ion source temperature: 50° C.

Mass resolving power: 1,000 M/ΔM

Accelerating voltage: 4 kV

Cathode voltage: −2.6 kV

Scanning speed: 0 to 1,875 amu/8 seconds (3) NMR (nuclear magnetic resonance) analysis:

An FT(Fourier transform)-NMR analyzer AC-250, manufactured by Bruker Co., was used. Deuterated chloroform or deuterated methanol was used as a measurement solvent.

Synthesis Example 1

(1) Synthesis of phenolic resin 1:

Into a 2-liter flask having a stirrer, a condenser and a thermometer, 405 g of 1-naphthol, 298 g of phenol and 228 g of 37% (weight/weight) formalin were put, and temperature was raised to 100° C. in an oil bath, followed by refluxing for 1 hour.

Next, 2 ml of 2 N hydrochloric acid was added, and the reaction was carried out for 4 hours at a temperature where the water in system was refluxed. Then, the temperature was raised to 165° C., and the reaction was carried out for 12 hours. Thereafter, the reaction solution was concentrated by heating it at 200° C. for 4 hours under reduced pressure to obtain a phenolic resin 1, having a number average molecular weight of 410, unreacted naphthol in a content of 6% (weight/weight), a polydispersity of 1.58, a softening point of 90° C. and a hydroxyl group equivalent weight of 174. Naphthol content was 63 mole %.

In FD-MS spectrum of the phenolic resin 1 thus obtained, fragment peaks ascribable to the following structures (IX) and (X), having theoretical molecular weights of 388.46 and 438.52, respectively, were observable as shown in FIG. 1.

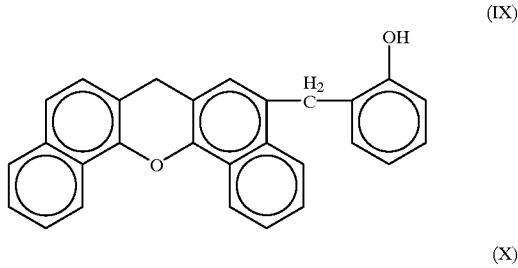

(IX)

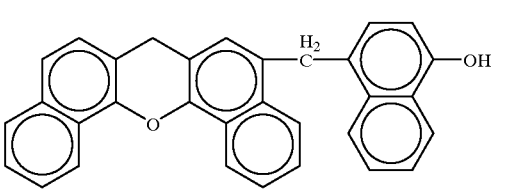

(X)

(2) Separation and identification of low-molecular weight component:

The phenolic resin 1 obtained was separated by the following technique of successive solution fractionation, using an acetone/n-hexane mixed solvent, and components having 3 or less nuclides were collected.

Figure 2:
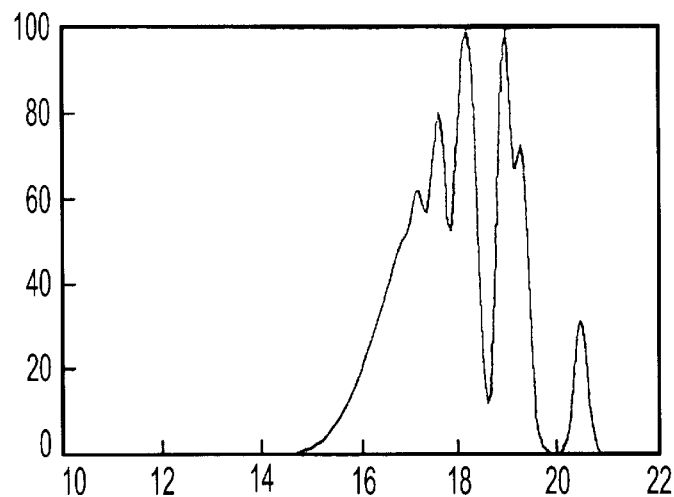
FIG. 2 is a GPC (gel permeation chromatography) chromatogram of the resin obtained in Synthesis Example 1.
Figure 3:
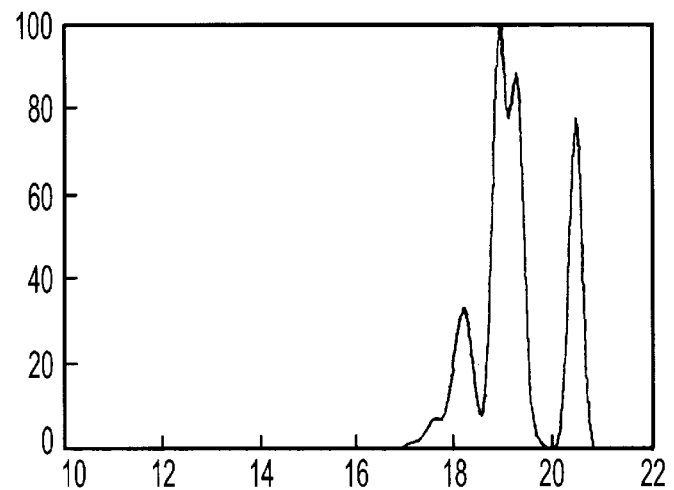
FIG. 3 is a GPC chromatogram of a low-molecular weight component of the resin obtained in Synthesis Example 1.

First, in a 2-liter flask having a stirrer and a dropping funnel, 30 g of the resin obtained was dissolved in 50 ml of acetone. To the solution obtained, a mixed solvent of 50 ml of acetone and 400 ml of n-hexane was added dropwise and thereafter the mixture was allowed to stand to separate it into two phases (concentrated phase and dilute phase). Incidentally, low-molecular weight components dissolve Into the dilute phase. GPC charts of the mixture before separation and the low-molecular weight components after separation are shown in FIGS. 2 and 3, respectively.

Figure 4:
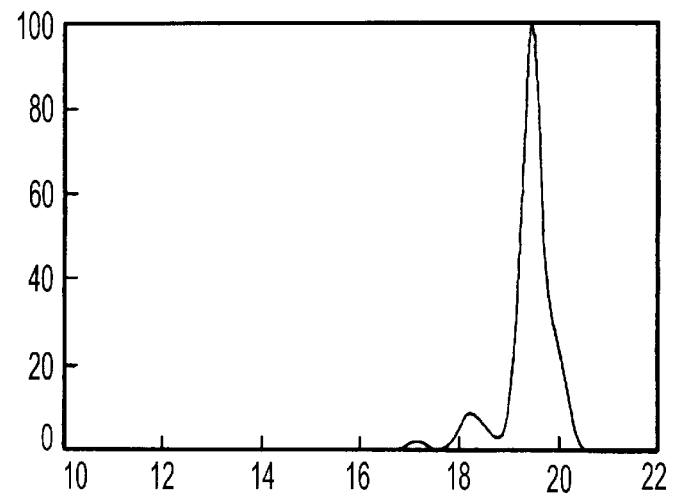
FIG. 4 is a GPC chromatogram of a low-molecular weight component of the resin obtained in Synthesis Example 1, separated by thin-layer chromatography.
Figure 5:
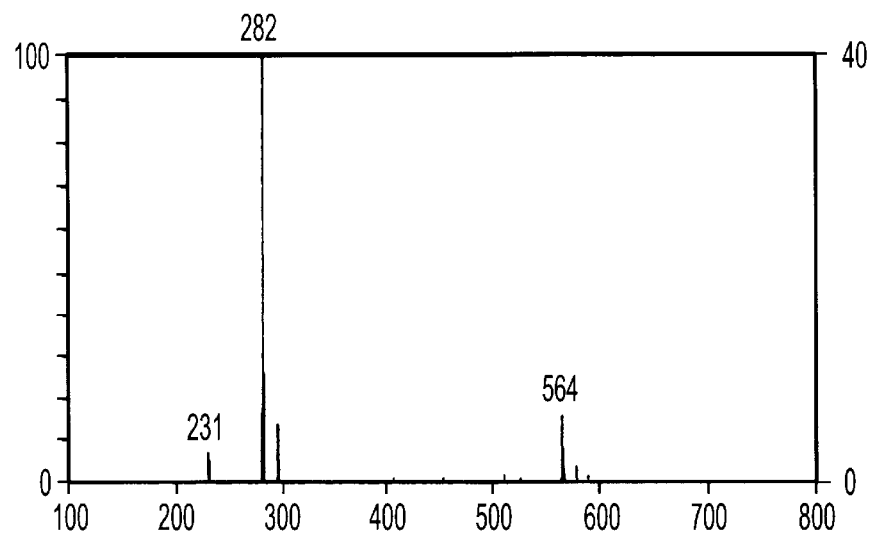
FIG. 5 is an FD-MS spectrum of a low-molecular weight component of the resin obtained in Synthesis Example 1, separated by thin-layer chromatography.
Figure 6:
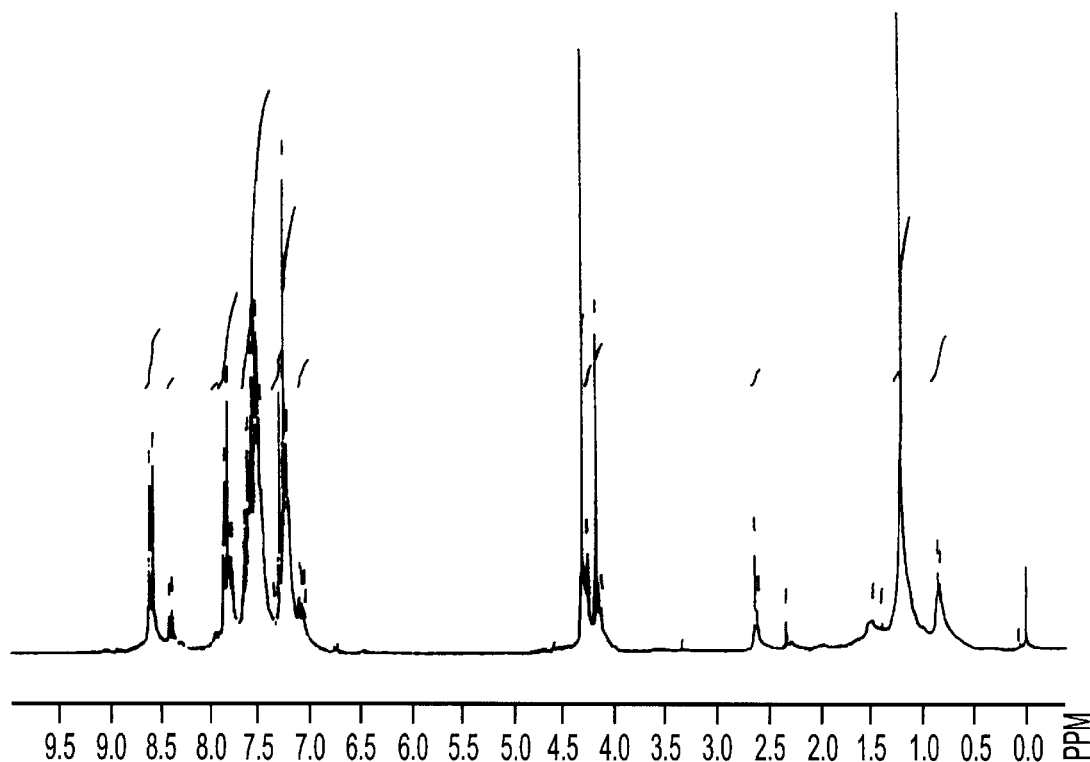
FIG. 6 is a $^1$H-NMR (nuclear magnetic resonance) spectrum of a low-molecular weight component of the resin obtained in Synthesis Example 1, separated by thin-layer chromatography.

The dilute phase thus separated was concentrated by means of an evaporator and separated by thin-layer chromatography (PCL plates silica gel 60F254, available from Aldrich Chemical Co., Inc.; 20×20 cm, 2 mm thick), using 4/1 (volume ratio) toluene/hexane in the mobile phase, where spots of Rf=0.8 to 0.9 were scraped off and extracted with acetone. Results of the measurement by GPC, FD-MS and NMR after separation are shown in FIGS. 4, 5 and 6, respectively. From FIGS. 5 and 6, a fragment peak ascribable to the following compound (a), having a theoretical molecular weight of 282, is observable.

Compound (a)

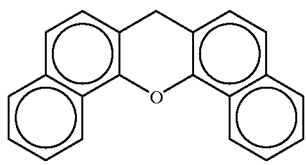

Now that this compound (a) was identified, it was ascertained that the following molecular structure (I) was contained in the skeleton of the phenolic resin 1.

(I)

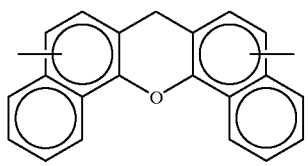

Synthesis Example 2

Synthesis of phenolic resin 2:

First, into a 2-liter flask having a stirrer, a condenser and a thermometer, 720 g of 1-naphthol, 216 g of o-cresol, 228 g of 37% (weight/weight) formalin and 2 g of oxalic acid were put, and temperature was raised to 100° C. in an oil bath, followed by reaction for 4 hours at a temperature where the water in system was refluxed. Then, the temperature was raised to 150° C., 3 ml of 5 N hydrochloric acid was added, and the reaction was carried out for 12 hours.

Thereafter, the reaction solution was concentrated by heating it at 200° C. for 4 hours under reduced pressure to obtain a phenolic resin 2, having a number average molecular weight of 450, unreacted naphthol in a content of 7%, a polydispersity of 1.59, a softening point of 100° C. and a hydroxyl group equivalent weight of 177. Naphthol content was 75 mole %.

Figure 7A:
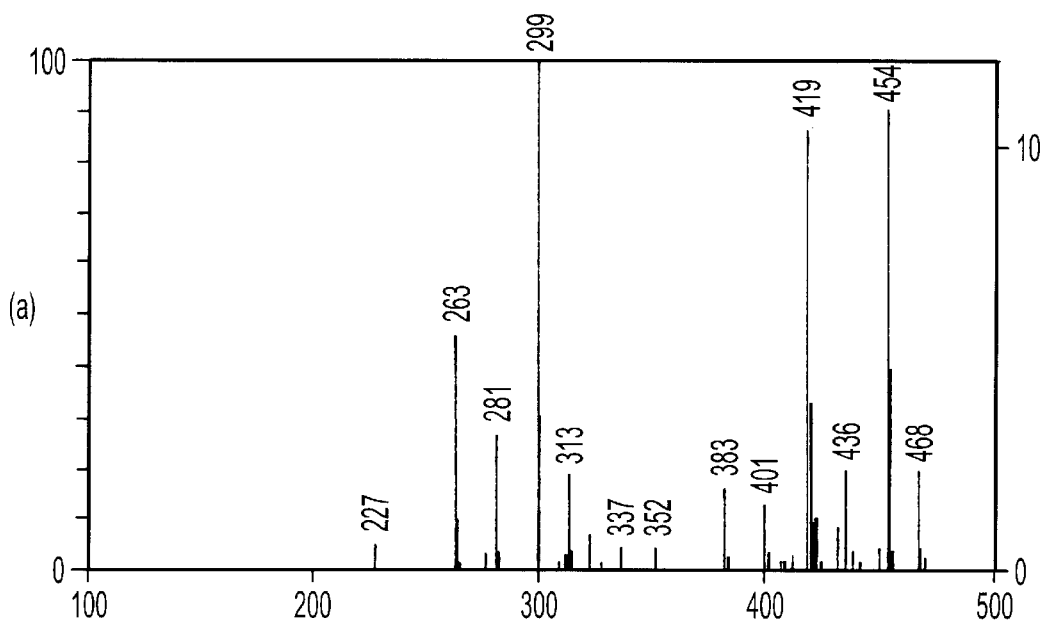
FIGS. 7A and 7B are an FD-MS spectrum of a resin obtained in Synthesis Example 2.
Figure 7B:
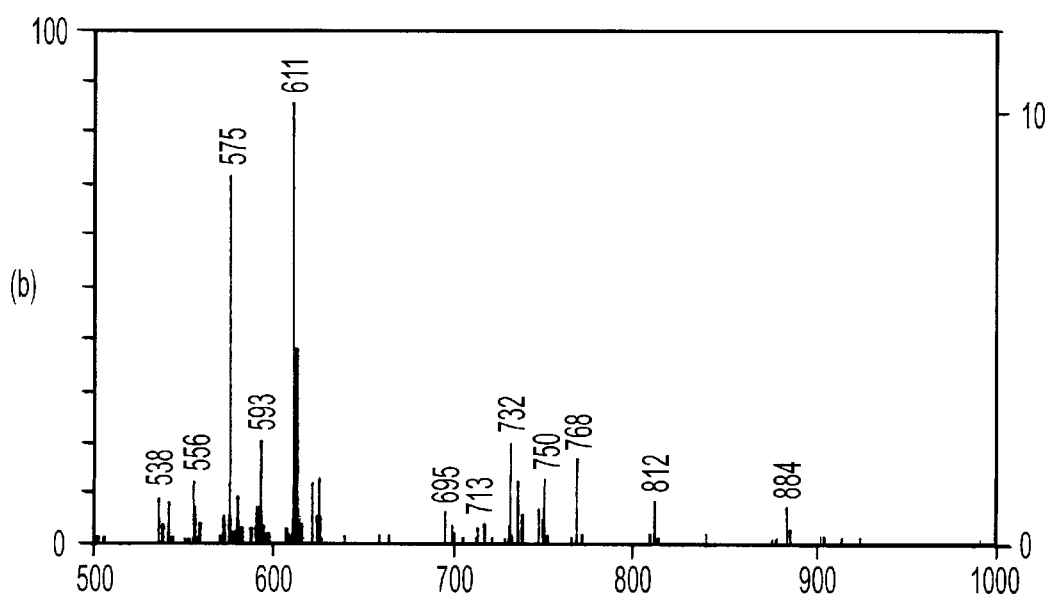

FD-MS spectrum of the phenolic resin 2 thus obtained is shown in FIGS. 7(a) and 7(b). From this chart, fragment peaks ascribable to the following structures (XI) and (X), having theoretical molecular weights of 402.46 and 438.52, respectively, are observable.

(XI)

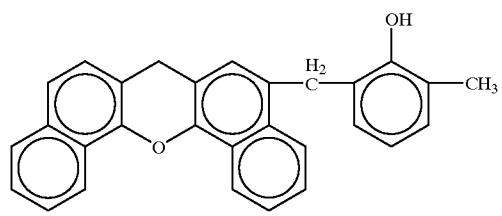

(X)

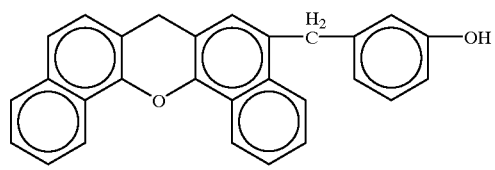

Synthesis Example 3

Synthesis of phenolic resin 3:

First, into a 2-liter flask having a stirrer, a condenser and a thermometer, 636 g of 1-naphthol, 426 g of phenol, 326 g of 37% (weight/weight) formalin and 2 g of oxalic acid were put, and temperature was raised to 100° C. in an oil bath, followed by refluxing for 1 hour at a temperature where the water in system was refluxed. Then, the temperature was raised to 150° C., 3 ml of 5 N hydrochloric acid was added, and the reaction was carried out for 8 hours.

Thereafter, the reaction solution was concentrated by heating it at 200° C. for 5 hours under reduced pressure to obtain a phenolic resin 3, having a number average molecular weight of 470, unreacted naphthol in a content of 3% (weight/weight), a polydispersity of 1.62, a softening point of 105° C. and a hydroxyl group equivalent weight of 180. Naphthol content was 70 mole %.

Figure 8:
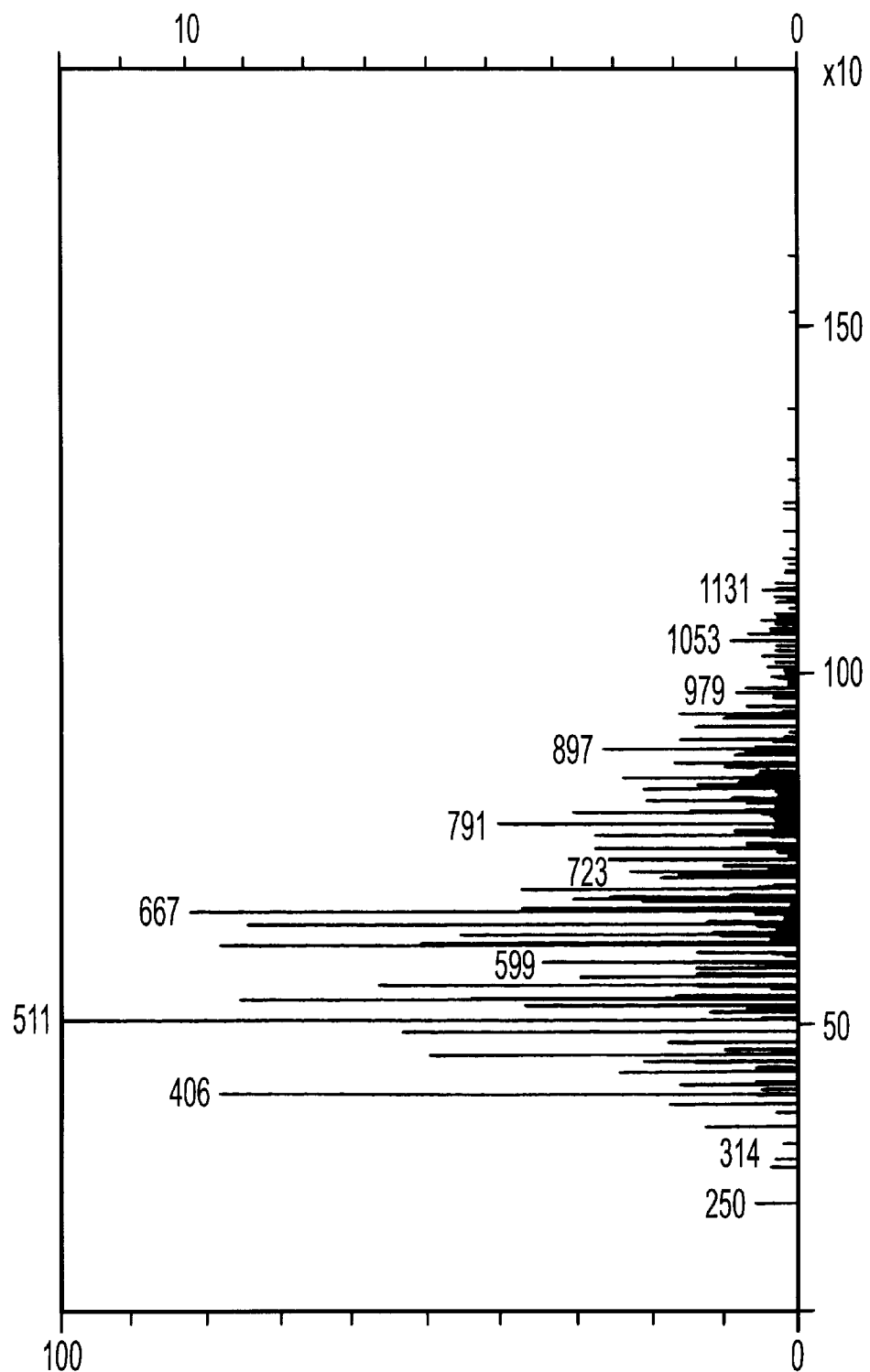
FIG. 8 is an FD-MS spectrum of a resin obtained in Synthesis Example 3.

FD-MS spectrum of the phenolic resin 3 thus obtained is shown in FIG. 8. From this chart, fragment peaks ascribable to the following structures (IX) and (X), having theoretical molecular weights of 388.46 and 438.52, respectively, are observable.

(IX)

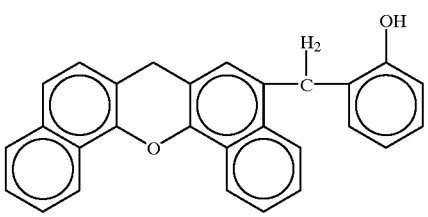

(X)

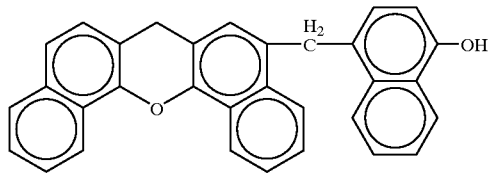

Synthesis Example 4

Synthesis of phenolic resin 4:

First, into a 2-liter flask having a stirrer, a condenser and a thermometer, 530 g of 2-naphthol, 391 g of phenol and 280 g of 37% (weight/weight) formalin were put, and temperature was raised to 100° C. in an oil bath, followed by refluxing for 1 hour to carry out reaction.

Next, 2 ml of 5N hydrochloric acid was added, and the reaction was carried out for 4 hours at a temperature where the water in system was refluxed. Then, the temperature was raised to 165° C., and the reaction was continued for 12 hours.

Thereafter, the reaction solution was concentrated by heating it at 180° C. for 1 hour under reduced pressure, and unreacted phenol was removed. Thereafter, the temperature of the reaction system was dropped to 90° C., and 80 g of 37% (weight/weight) formalin was added to carry out the reaction for 1 hour.

Finally, the water in system was removed under reduced pressure to obtain 760 g of a phenolic resin 4, having a number average molecular weight of 418, unreacted naphthol in a content of 5.3%, a polydispersity of 1.95 and a hydroxyl group equivalent weight of 245.

Figure 9:
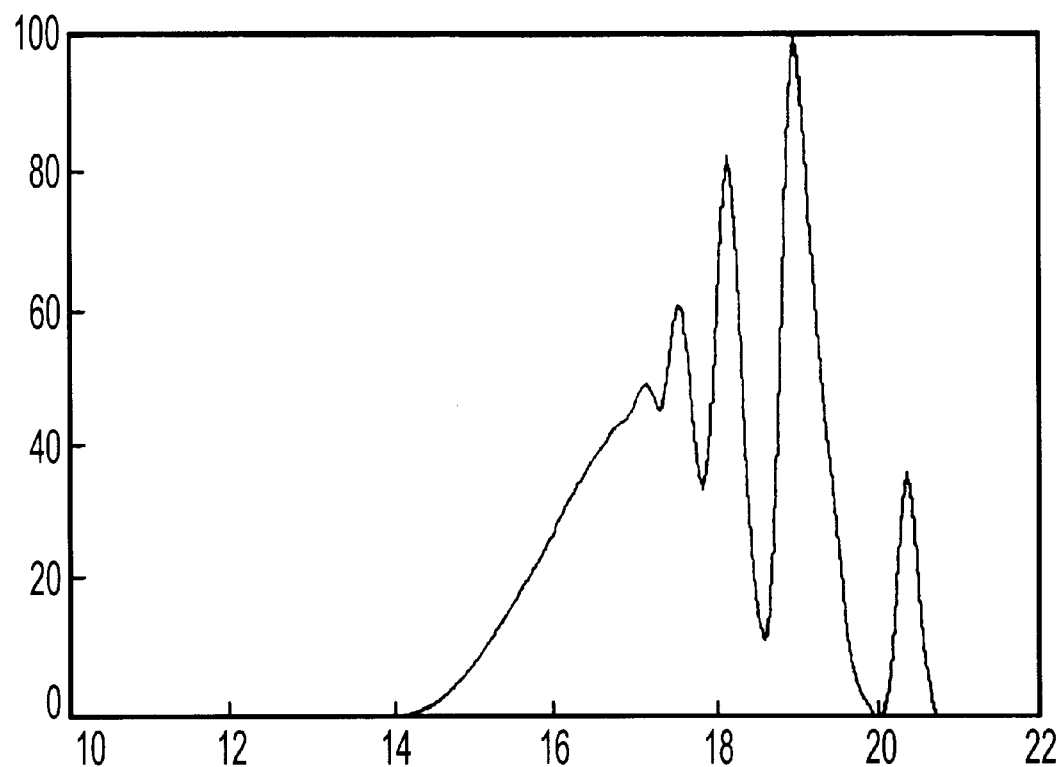
FIG. 9 is a GPC chromatogram of a resin obtained in Synthesis Example 4.
Figure 10:
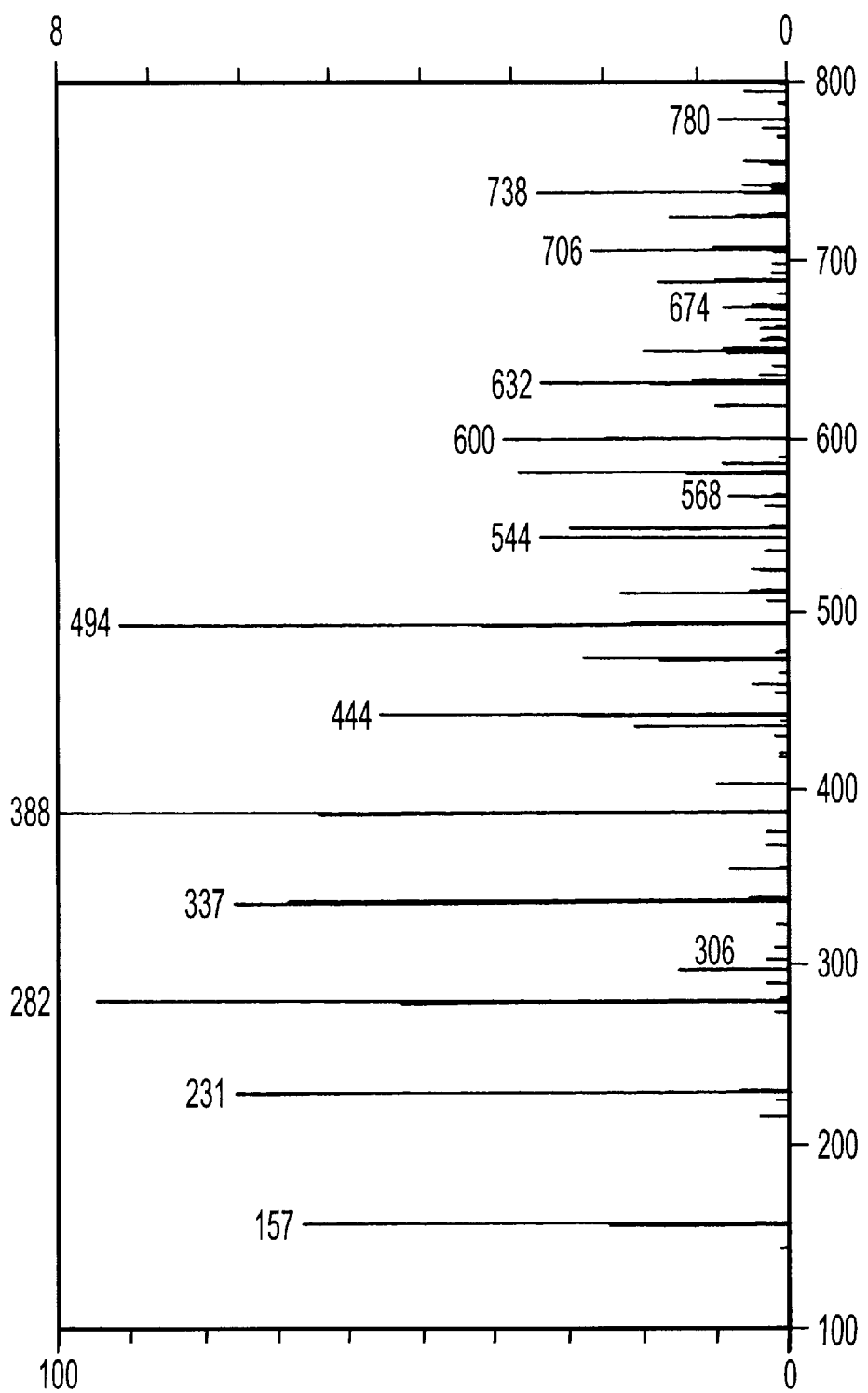
FIG. 10 is an FD-MS spectrum of the resin obtained in Synthesis Example 4.

GPC chart and FD-MS spectrum of the phenolic resin 4 thus obtained are shown in FIGS. 9 and 10, respectively. From these charts, fragment peaks ascribable to the following structures (XII), (XIII), (XIV) and (XV), having theoretical molecular weights of 282, 388, 494 and 544, respectively, are observable.

(XII)

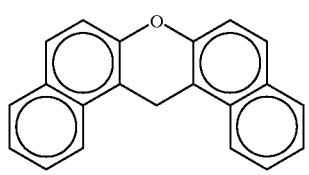

(XIII)

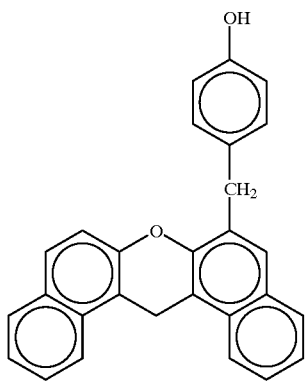

(XIV)

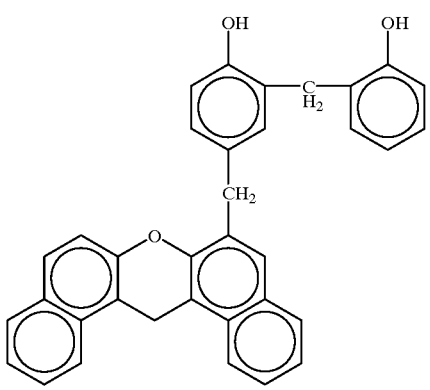

(XV)

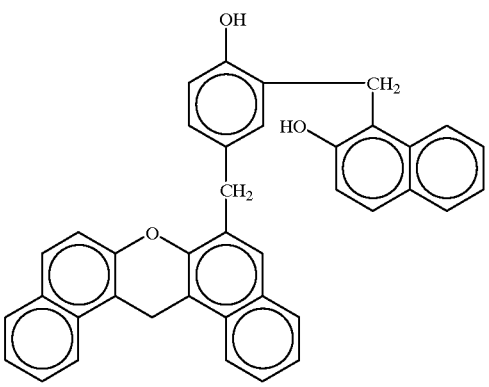

Synthesis Example 5

Synthesis of phenolic resin 5:

First, into a 2-liter flask having a stirrer, a condenser and a thermometer, 500 g of 2-naphthol, 216 g of o-cresol, 228 g of 37% (weight/weight) formalin and 2 g of oxalic acid were put, and temperature was raised to 100° C. in an oil bath, followed by reaction for 4 hours at a temperature where the water in system was refluxed. Then, the temperature was raised to 150° C., 3 ml of 5N hydrochloric acid was added, and the reaction was carried out for 12 hours.

Thereafter, the reaction solution was concentrated by heating it at 200° C. for 4 hours under reduced pressure to obtain a phenolic resin 5, having a number average molecular weight of 445, unreacted naphthol in a content of 6.4%, a polydispersity of 1.91, and a hydroxyl group equivalent weight of 209.

Figure 11:
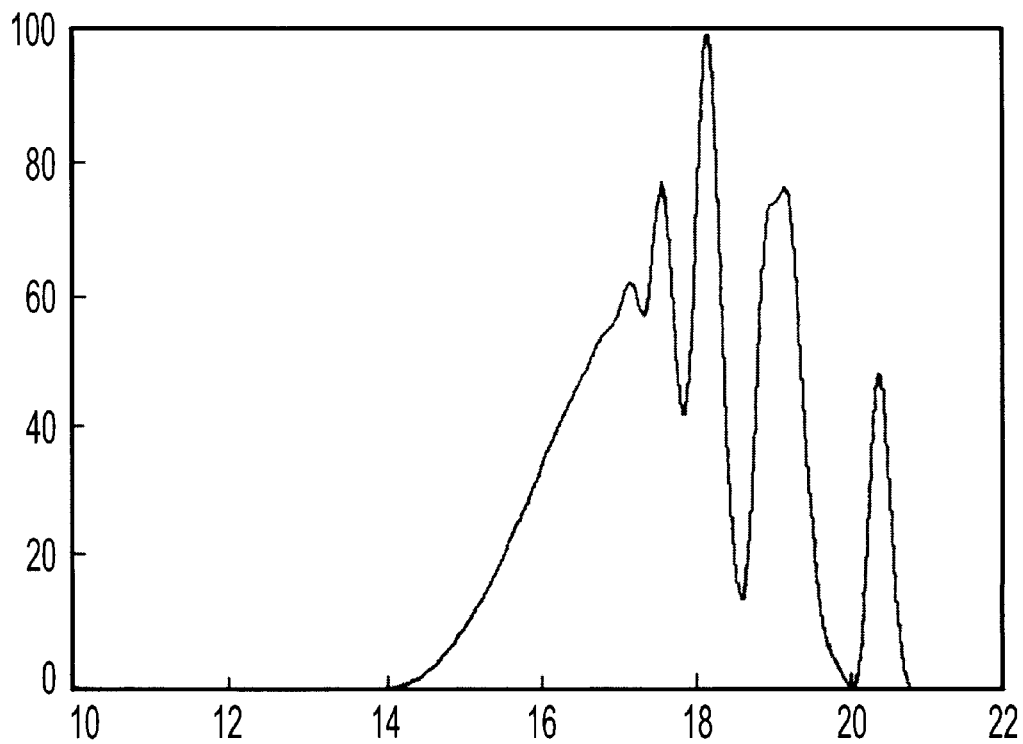
FIG. 11 is a GPC chromatogram of a resin obtained in Synthesis Example 5.
Figure 12:
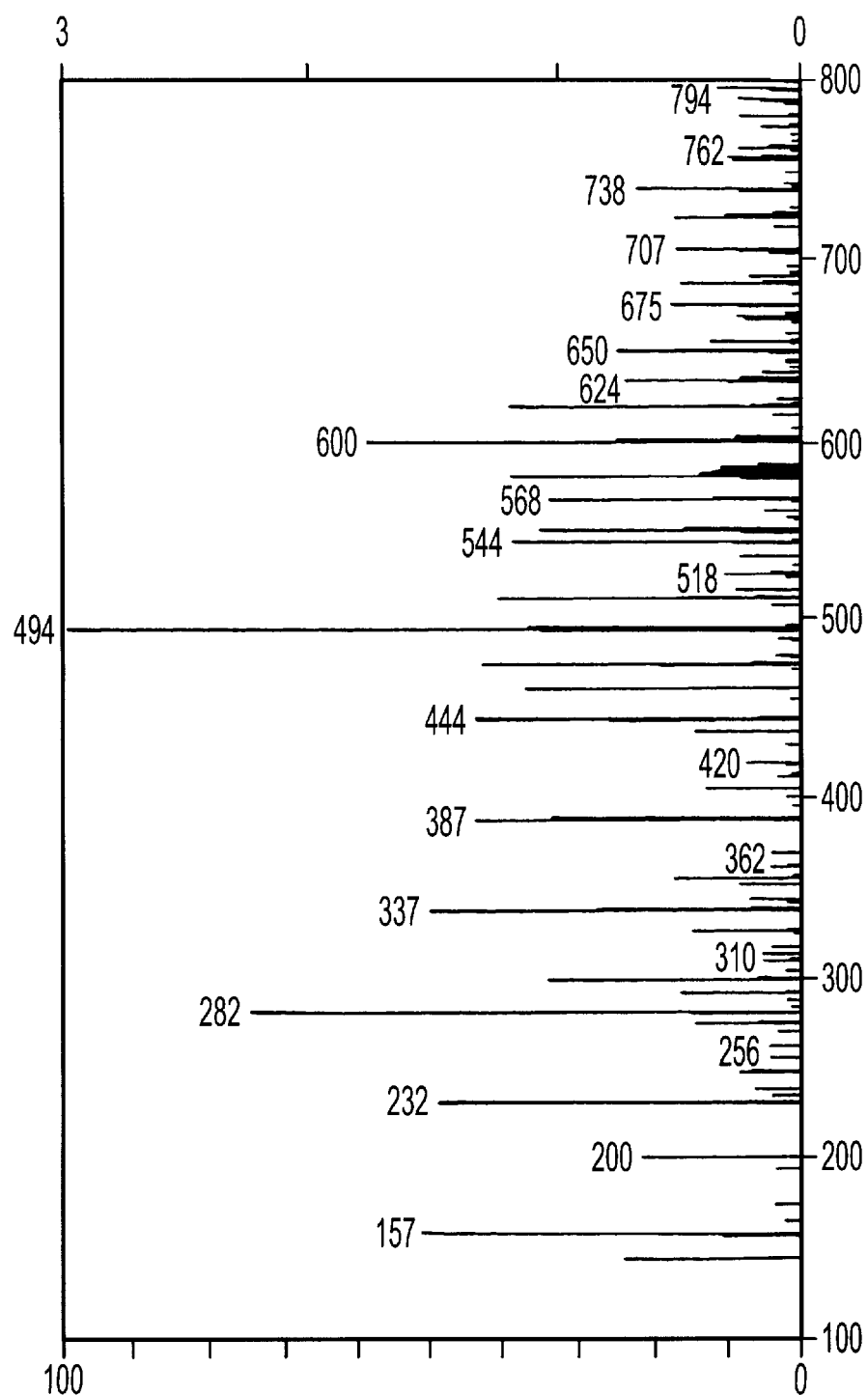
FIG. 12 is an FD-MS spectrum of the resin obtained in Synthesis Example 5.

GPC chart and FD-MS spectrum of the phenolic resin 5 thus obtained are shown in FIGS. 11 and 12, respectively. From these charts, like Synthesis Example 5, fragment peaks ascribable to the above structures (XII), (XIII), (XIV) and (XV), having theoretical molecular weights of 282, 388, 494 and 544, respectively, are observable.

Synthesis Example 6

Synthesis of phenolic resin 6:

First, into a 2-liter flask having a stirrer, a condenser and a thermometer, 470 g of 2-naphthol, 703 g of phenol, 326 g of 37% (weight/weight) formalin and 2 g of oxalic acid were put, and temperature was raised to 100° C. in an oil bath, followed by reaction for 4 hours at a temperature where the water in system was refluxed. Then, the temperature was raised to 150° C., 3 ml of 5N hydrochloric acid was added, and the reaction was carried out for 8 hours.

Thereafter, the reaction solution was concentrated by heating it at 200° C. for 5 hours under reduced pressure to obtain a phenolic resin 6, having a number average molecular weight of 457, unreacted naphthol in a content of 4.12%, a polydispersity of 2.05, and a hydroxyl group equivalent weight of 177.

Figure 13:
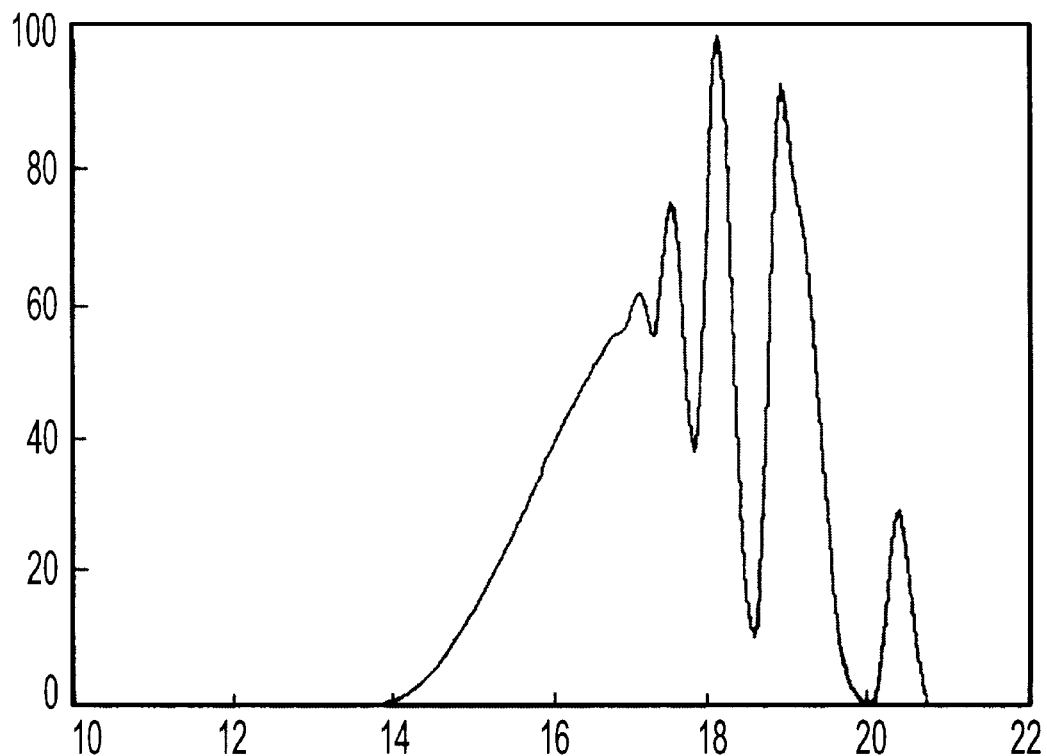
FIG. 13 is a GPC chromatogram of a resin obtained in Synthesis Example 6.
Figure 14:
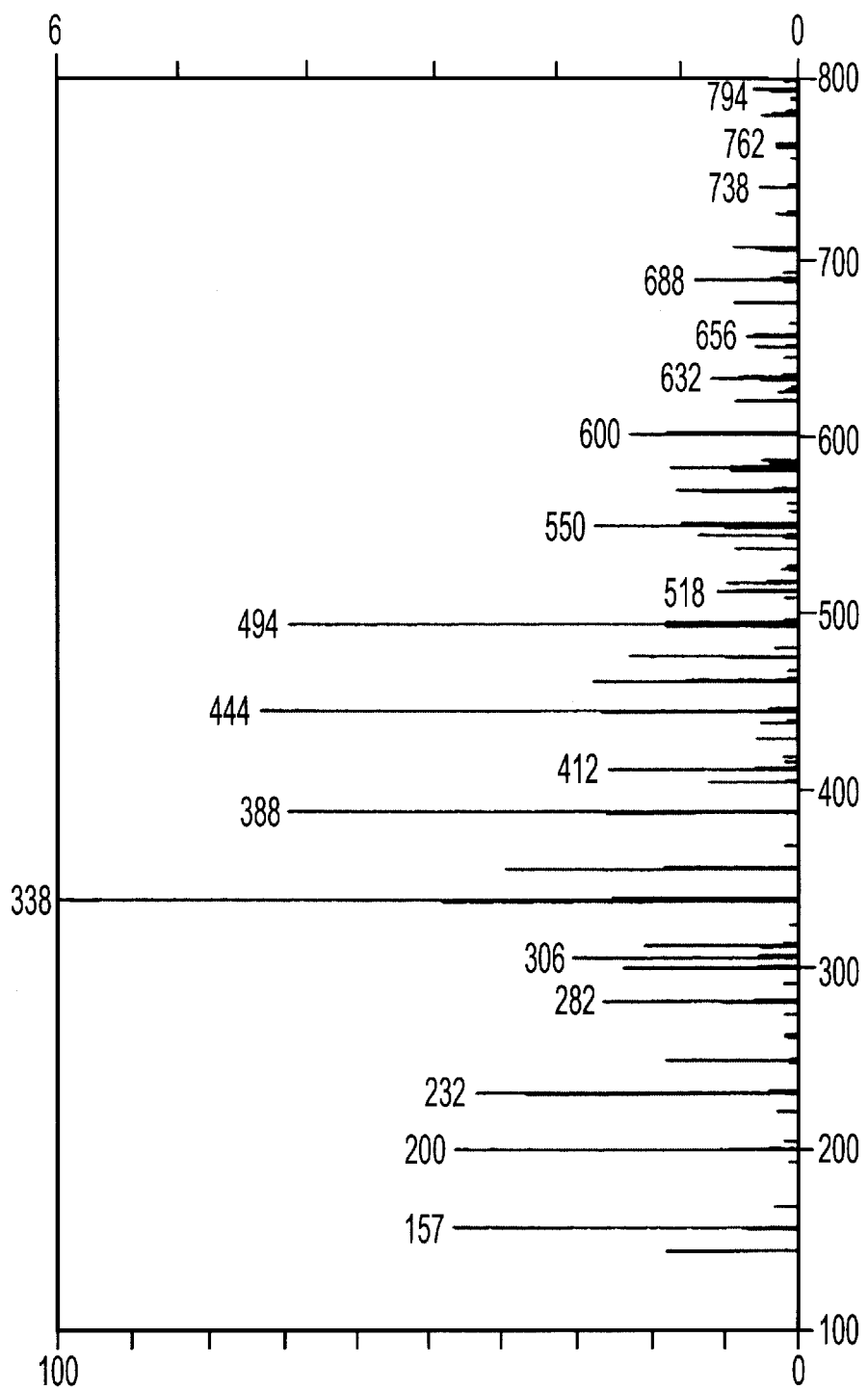
FIG. 14 is an FD-MS spectrum of the resin obtained in Synthesis Example 6.
Figure 15:
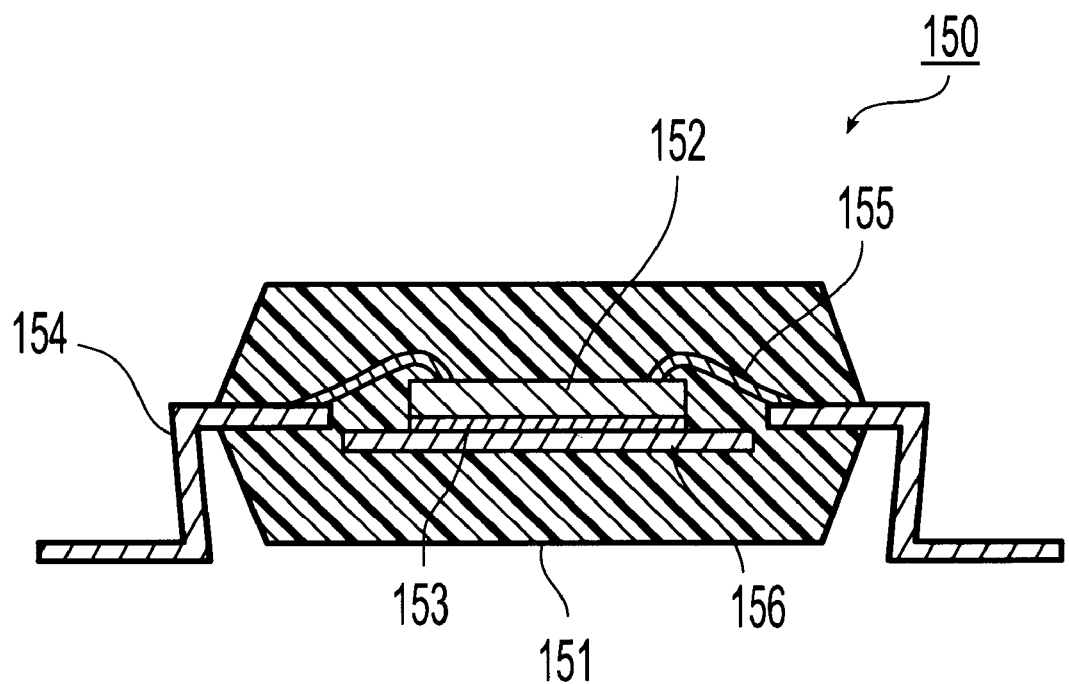
FIG. 15 is a cross section showing a semiconductor package produced in each Example.

GPC chart and FD-MS spectrum of the phenolic resin 6 thus obtained are shown in FIGS. 13 and 14, respectively. From these charts, like Synthesis Example 4, fragment peaks ascribable to the above structures (XII), (XIII) and (XIV), having theoretical molecular weights of 282, 388 and 494, respectively, are observable.

B. Examples and comparative examples of molding materials:

Examples (working examples) and comparative examples of the present invention are given below. The properties of molding epoxy resin materials prepared in the following examples and comparative examples were evaluated by the test methods (1) to (7) shown below. To evaluate properties of cured products on items (3) to (7) in these tests, used were test pieces molded in given molds under conditions of 180° C., 90 seconds and 6.9 MPa and cured after 5 hours at 180° C.

(1) Spiral flow (SF: an index of flow properties):

According to ASTM D3133, flow distance (cm) was determined under conditions of 180° C. and a molding pressure of 6.9 MPa.

(2) Gel time (GT):

Using Curelastometer, manufactured by JSR, the time until the rise of a torque curve was measured on 3 g of a sample at a temperature of 180° C.

(3) Glass transition point (Tg) and coefficient of linear expansion ($\alpha 1$, $\alpha 2$):

Glass transition point (Tg; unit: °C.) was determined from the bending point of a curve of linear expansion measured with a thermomechanical analyzer (TMA-8141BS, TAS-100) manufactured by Rigaku International Corporation, using a test piece of 19 mm×4 mm×4 mm in size and at a rate of temperature rise of 5° C./minute. Also, coefficient of linear expansion a1 in the glass region was determined from the slope at a temperature of Tg or below of a linear expansion curve; and coefficient of linear expansion $\alpha 2$ in the rubber region, from the slope at a temperature of Tg or above.

(4) Rate of moisture absorption:

A disk of 50 mm diameter and 3 mm thick according to JIS K-6911 was molded using a measuring target resin composition, and was moistened under conditions of 85° C., 85% RH and 500 hours, where the rate of weight gain was regarded as water absorption to determine the rate of moisture absorption.

(5) Molding shrinkage:

Diameter of the disk used to measure the rate of moisture absorption was measured in a direction normal with its gate direction, and the molding shrinkage was calculated according to the following expression.

$$\text{Molding shrinkage} = (L_0 - L)L_0 \times 100$$

(6) Aluminum peel strength (an index of adhesive properties):

Using a mold for aluminum peel test, a test piece of 100 mm×70 mm×3 mm was molded on aluminum foil of 30 μm thick under conditions of 180° C., 90 seconds and 6.9 MPa. Aluminum foil of 10 mm wide was peeled in its vertical direction, and its strength was measured. The measurement was made using Tensilon, manufactured by Toyo Baldwin Co., Ltd., under conditions of a head speed of 50 mm/minute.

(7) Bending test:

A three-point bending test according to JIS K-6911 was made using Tensilon, manufactured by Toyo Baldwin Co., Ltd., to determine flexural modulus (E; unit: GPa), flexural strength (S; unit: MPa) and breaking extension (E; unit: %). The measurement was made using a test piece of 70 mm×10 mm×3 mm under conditions of a head speed of 1.5 mm/minute.

Examples 1 to 6

The phenolic resins 1 to 6 obtained in Synthesis Examples 1 to 6 were used as curing agents, which were each mixed together with 78 parts (parts by weight; the same applies hereinafter) of a methyl-group-substituted biphenyl skeleton type epoxy resin having an epoxy equivalent weight of 190 (YX-4000H was used, available from Yuka Shell Epoxy Kaisha), 18 parts of a brominated bisphenol epoxy resin (ESB-400T), 2.5 parts of triphenylphosphine, 3 parts of carnauba wax, 1 part of carbon black, 4 parts of γ-glycidoxypropyltrimethoxysilane and 1,200 parts of silica glass powder. The mixtures obtained were kneaded at 85 to 95° C. for 8 to 13 minutes each by means of a heat roll of 8 inches diameter to obtain molding epoxy resin materials of Examples 1 to 6 for encapsulating electronic component parts.

The phenolic resins used were mixed in an amount of 96 parts for the phenolic resins 1 to 3, 109 parts for the phenolic resin 4, 93 parts for the phenolic resin 5, and 79 parts for the phenolic resin 6.

On the molding materials thus obtained, the spiral flow (SF), gel time (GT), glass transition point (Tg), coefficient of linear expansion ($\alpha 1$, $\alpha 2$), rate of moisture absorption, molding shrinkage, aluminum peel strength (an index of adhesive properties), flexural modulus (E), flexural strength (S) and breaking extension (E) were evaluated. Results obtained are shown in Table 1.

Comparative Examples 1 & 2

Using as a curing agent 96 parts of XYLOK RESIN XL-225, available from Mitsui Toatsu Chemicals, Inc., a molding epoxy resin material of Comparative Example 1 was obtained in the same manner as in Examples.

Using as a curing agent 96 parts of naphthol resin NH-7000, available from Nippon Kayaku Co., Ltd., a molding epoxy resin material of Comparative Example 2 was obtained in the same manner as in Examples.

On the molding materials thus obtained, their properties were evaluated in the same manner as in the above Examples to obtain the results shown in Table 1.

TABLE 1

|  | Example | | | | | | Comparative Example | |
| --- | --- | --- | --- | --- | --- | --- | --- | --- |
|  | 1 | 2 | 3 | 4 | 5 | 6 | 1 | 2 |
| SF (cm): | 114 | 112 | 114 | 135 | 125 | 118 | 126 | 85 |
| GT (s): | 21 | 20 | 21 | 30 | 29 | 25 | 21 | 21 |
| Tg (° C.): | 135 | 132 | 140 | 137 | 142 | 141 | 110 | 145 |
| $\alpha 1$ ($\times 10^{-5}$): | 0.85 | 0.95 | 0.82 | 0.83 | 0.88 | 0.92 | 1.19 | 1.05 |
| $\alpha 2$ ($\times 10^{-5}$): | 4.22 | 4.32 | 4.34 | 3.95 | 3.82 | 4.11 | 4.42 | 4.35 |
| Molding shrinkage: | 0.03 | 0.05 | 0.03 | 0.03 | 0.04 | 0.03 | 0.15 | 0.12 |
| Rate of moisture absorption: | 0.288 | 0.255 | 0.292 | 0.235 | 0.245 | 0.282 | 0.295 | 0.29 |
| Aluminum peel: | 700 | 650 | 600 | 500 | 550 | 570 | 750 | 300 |
| E (GPa): | 25.0 | 25.3 | 26.5 | 24.0 | 24.3 | 25.5 | 23.9 | 26.0 |
| S (MPa): | 156 | 164 | 172 | 159 | 162 | 169 | 187 | 167 |
| $\epsilon$ (%): | 0.65 | 0.72 | 0.75 | 0.75 | 0.73 | 0.74 | 0.98 | 0.58 |

C. Examples and comparative examples of electronic component device:

Using each of the molding materials obtained in Examples 1 to 6 and Comparative Examples 15 and 2, a semiconductor package as shown in FIG. 1 was produced.

First, a device element 152 of 8 mm×10 mm was mounted to an island area 156 of a 42 alloy lead frame 154, using a conductive paste 153 containing silver powder, followed by bonding with gold wires 155.

Next, the device element 152 thus mounted was encapsulated by transfer molding under conditions of 180° C., 90 seconds and 6.9 MPa, using a molding material 151 of each Example or Comparative Example, to mold a 80-pin QFP (quad flat package) of 20 mm×14 mm and 2 mm thick, followed by heating at 180° C. for 5 hours to cure. Thus, a semiconductor package 150 whose device element 152 was encapsulated with the molding material 151 was produced.

(2) Evaluation on electronic component device:

The package 150 thus obtained was moistened for a prescribed time using a thermo-hygrostat and under conditions of 85° C./85% RH, and thereafter was immediately heated using a vapor phase reflow unit and under conditions of 215° C./90 seconds. After the temperature was returned to room temperature, whether or not any cracks appeared was observed with a stereoscopic microscope or an ultrasonic detector to evaluate reflow crack resistance by (number of defectives/population parameter). Results obtained are shown in Table 2.

TABLE 2

|  |  | Example | | | | | | Comparative Example | |
| --- | --- | --- | --- | --- | --- | --- | --- | --- | --- |
| Molding material: | | 1 | 2 | 3 | 4 | 5 | 6 | 1 | 2 |
| Moistening time: | 48 hrs: | 0/5 | 0/5 | 0/5 | 0/5 | 0/5 | 0/5 | 0/5 | 0/5 |
|  | 96 hrs: | 0/5 | 0/5 | 0/5 | 0/5 | 0/5 | 0/5 | 0/5 | 5/5 |
|  | 168 hrs: | 0/5 | 0/5 | 1/5 | 0/5 | 0/5 | 1/5 | 1/5 | 5/5 |

D. Results of evaluation:

As can be seen from Tables 1 and 2, the molding materials of Comparative Examples, not containing any phenolic resin of the present invention, do not fulfill any sufficient properties. More specifically, the material of Comparative Example 1 has a low Tg and a high molding shrinkage. Also, that of Comparative Example 2 not only has a high molding shrinkage but also has poor flow properties, adhesive properties and reflow crack resistance.

On the other hand, the molding materials of Examples 1 to 6 making use of the phenol resins of the present invention as the curing agent for epoxy resins have good flow properties, a high glass transition point, a low moisture absorption, a low molding shrinkage, and good adhesive properties and reflow crack resistance.

POSSIBILITY OF INDUSTRIAL APPLICATION

As described above, the molding epoxy resin material, making use of the phenolic resin obtained by the present invention as the epoxy resin curing agent has superior flow properties, glass transition point and so forth. Semiconductor devices produced using this material have a superior reflow crack resistance.

In the field of electronic component devices, in particular, IC packages such as QFP (quad flat package) and BGA, packages have become thin-gaged and small-sized and also devices have become large-sized, where they are required to have a high glass transition point and a high reflow crack resistance. The phenolic resin and molding material obtained by the present invention can be applied to such products, promising a great industrial merit.

What is claimed is:

1. A phenolic resin containing in the backbone chain a structural unit represented by the following Formula (I).

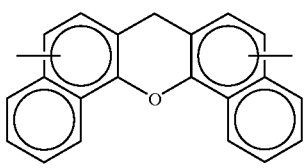
(I)

2. A phenolic resin containing in the backbone chain a structural unit represented by the following Formula (II).

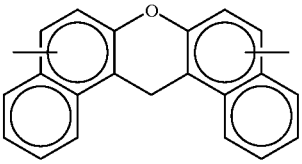
(II)

3. The phenolic resin according to claim 1, which is represented by the following Formula (III).

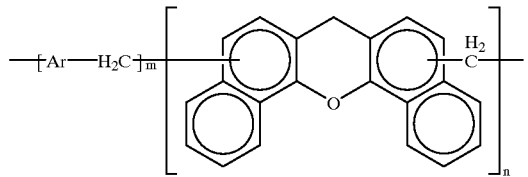
(III)

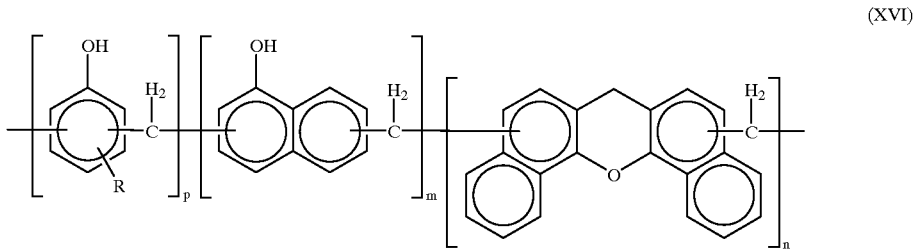
(IV)

wherein m and n each represent a positive number; Ar represents at least one of divalent organic groups represented by

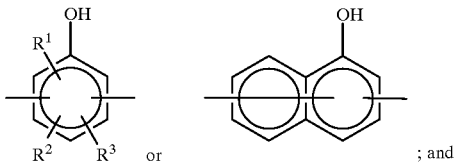
; and $R^1$ to $R^3$ are groups each independently selected from a hydrogen atom and an alkyl group having 1 to 9 carbon atoms.

5. The phenolic resin according to claim 3, wherein the total of m and n is not more than 10 on the number average.

6. The phenolic resin according to claim 4, wherein the total of m and n is not more than 10 on the number average.

7. The phenolic resin according to claim 1, which is represented by the following Formula (XVI):

(XVI)

wherein m and n represents a positive number; Ar represents at least one of divalent organic groups represented by ; and $R^1$ to $R^3$ are groups each independently selected from a hydrogen atom and an alkyl group having 1 to 9 carbon atoms.

4. The phenolic resin according to claim 2, which is represented by the following Formula (IV).

wherein R represents a hydrogen atom or an alkyl group having 1 to 9 carbon atoms; and m, n and p each represent a positive number.

8. The phenolic resin according to claim 2, which is represented by the following Formula (XVII):

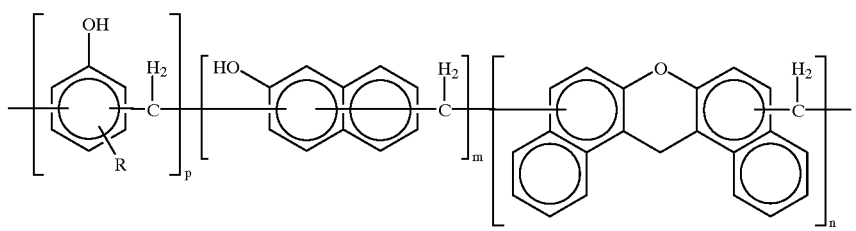

(XVII)

wherein R represents a hydrogen atom or an alkyl group having 1 to 9 carbon atoms; and m, n and p each represent a positive number.

9. The phenolic resin according to claim 7, wherein the total of m, n and p is not more than 10 on the number average.

10. The phenolic resin according to claim 8, wherein the total of m, n and p is not more than 10 on the number average.

11. A resin composition comprising the phenolic resin according to claim 1.

12. A resin composition comprising the phenolic resin according to claim 2.

13. A resin composition comprising the phenolic resin according to claim 3.

14. A resin composition comprising the phenolic resin according to claim 4.

15. A resin composition comprising the phenolic resin according to claim 7.

16. A resin composition comprising the phenolic resin according to claim 8.

17. An encapsulation molding material essentially consisting of:
   (A) an epoxy resin;
   (B) an epoxy resin curing agent containing at least any of phenol resin according to claims 1, 2, 3, 4, 7 or 8; and
   (C) an inorganic filler.

18. The encapsulation molding material according to claim 17, wherein said (A) contains a biphenyl skeleton epoxy resin.

19. An electronic component device comprising:
   a device element encapsulated with the encapsulation molding material according to claim 17.

20. An electronic component device comprising:
   a device element encapsulated with the encapsulation molding material according to claim 18.

* * * * *